(12) United States Patent
Streckert

(10) Patent No.: US 9,524,367 B2
(45) Date of Patent: Dec. 20, 2016

(54) METHOD FOR CHECKING AN ARTICLE WITH MATERIAL-FREE REGIONS

(75) Inventor: Sandra Streckert, Aspach (DE)

(73) Assignee: EISENMANN AG, Boeblingen (DE)

( * ) Notice: Subject to any disclaimer, the term of this patent is extended or adjusted under 35 U.S.C. 154(b) by 375 days.

(21) Appl. No.: 14/239,020

(22) PCT Filed: Aug. 8, 2012

(86) PCT No.: PCT/EP2012/003375
§ 371 (c)(1),
(2), (4) Date: Apr. 15, 2014

(87) PCT Pub. No.: WO2013/023756
PCT Pub. Date: Feb. 21, 2013

(65) Prior Publication Data
US 2014/0222183 A1    Aug. 7, 2014

(30) Foreign Application Priority Data
Aug. 17, 2011   (DE) .................. 10 2011 110 861

(51) Int. Cl.
| | |
|---|---|
| *G01M 10/00* | (2006.01) |
| *G01N 21/88* | (2006.01) |
| *G01N 21/95* | (2006.01) |
| *G01N 21/954* | (2006.01) |
| *G06F 17/15* | (2006.01) |
| *G06F 17/50* | (2006.01) |
| *B29C 67/00* | (2006.01) |
| *B29C 33/38* | (2006.01) |

(Continued)

(52) U.S. Cl.
CPC ......... *G06F 17/5086* (2013.01); *B05B 12/149* (2013.01); *B05B 15/02* (2013.01); *B29C 33/3842* (2013.01); *B29C 33/3857* (2013.01); *B29C 67/0055* (2013.01); *B29C 67/0059* (2013.01); *B29C 67/0062* (2013.01); *B29C 67/0066* (2013.01); *B29C 67/0077* (2013.01); *B29C 67/0081* (2013.01)

(58) Field of Classification Search
CPC ..................... B29C 33/3842; B29C 2033/385; B29C 33/3857; B29C 67/0051; B29C 67/0055; B29C 67/0059; B29C 67/0062; B29C 67/0066; B29C 67/007; B29C 67/0074; B29C 67/0077; B29C 67/0081; B29C 67/0085; B29C 67/0088; B29C 67/0092; B29C 67/0096
USPC ............... 264/40.1, 113, 219, 308, 401, 460, 461,264/462, 463, 497
See application file for complete search history.

(56) References Cited

U.S. PATENT DOCUMENTS 5,146,051 A * 9/1992 Hermann .............. H04R 25/652
264/222 X
2002/0093115 A1* 7/2002 Jang .................... B29C 67/0081
264/113

(Continued)

FOREIGN PATENT DOCUMENTS

DE   24 26 228 A1   12/1975
DE   41 35 153 A1   4/1993

(Continued)

*Primary Examiner* — Leo B Tentoni
(74) *Attorney, Agent, or Firm* — Factor Intellectual Property Law Group, Ltd.

(57) ABSTRACT

A method for checking an article with material-free regions, a three-dimensional test structure of the article is set up, this test structure comprising a negative formation of the material-free regions.

10 Claims, 3 Drawing Sheets

(51) Int. Cl.
*B05B 12/14* (2006.01)
*B05B 15/02* (2006.01)

(56) References Cited

U.S. PATENT DOCUMENTS

| | | |
|---|---|---|
| 2005/0133955 A1* | 6/2005 | Christensen ....... A61C 13/0004 |
| | | 264/219 |
| 2005/0250075 A1 | 11/2005 | Taub et al. |
| 2007/0077537 A1 | 4/2007 | Taub et al. |
| 2007/0154867 A1 | 7/2007 | Taub et al. |
| 2011/0183294 A1 | 7/2011 | Taub et al. |
| 2011/0221100 A1 | 9/2011 | Wesselky et al. |

FOREIGN PATENT DOCUMENTS

| | | |
|---|---|---|
| DE | 197 47 551 C2 | 12/1999 |
| DE | 299 13 517 U1 | 1/2001 |
| DE | 10 2008 060 985 A1 | 6/2010 |
| DE | 20 2007 019 098 U1 | 9/2010 |
| WO | 2004/030565 A1 | 4/2004 |
| WO | 2010/028864 A2 | 3/2010 |

\* cited by examiner

METHOD FOR CHECKING AN ARTICLE WITH MATERIAL-FREE REGIONS

RELATED APPLICATIONS

This application is a national phase of International Patent Application No. PCT/EP2012/003375, filed Aug. 8, 2012, which claims the filing benefit of German Patent Application No. 10 2011 110 861.4, filed Aug. 17, 2011, the contents of both of which are incorporated herein by reference.

FIELD OF THE INVENTION

The invention relates to a method for checking an article with material-free regions.

BACKGROUND OF THE INVENTION

For example, components that are used in conjunction with the application of paints typically have relatively complicated duct systems that in this way define material-free regions of this component. An example of a component of this kind is a colour-changing unit which operates as a distributor unit and through which different paints are conveyed to an application means.

Generally of interest here are components through which fluid medium can flow and whereof the flow pathways are to be reproduced. Possible fluid media besides paints are for example adhesives, cleaning fluids, hydraulic fluids or similar and gaseous fluids such as, in particular, air, in the context for example of pneumatic control systems and the like.

In the design of a colour-changing unit as indicated above, undercuts, for example, may occur in the duct system, or narrow pockets and slots and narrow bends and the like may be formed therein, through which flow may be hampered by paint guided through the colour-changing unit. Thus, paint may accumulate in undercuts, for example, and these accumulations may in some cases contaminate another paint that flows past.

In the case of duct systems of relatively complicated design, the probability that critical locations of this kind will be present is correspondingly greater. Among other things, it is useful to identify locations of this kind already at an early stage during the design of a colour-changing unit or, in general, an article with material-free regions and where appropriate to eliminate these locations.

Nowadays, admittedly, components of this kind of complexity are frequently designed using established CAD systems which also enable three-dimensional display on a monitor or as a printed article and which typically allow the user to move in virtual space through the inner workings of the article and hence through an existing duct system.

However, in practice it is found that critical locations as indicated above are not particularly evident from this and so are frequently not recognised and eliminated.

For this reason, it is an object of the invention, to specify a method of the type mentioned at the outset in order to recognize critical locations of this kind in material-free regions of artciles.

SUMMARY OF THE INVENTION

This object may be achieved in the case of a method of the type mentioned at the outset in that a three-dimensional test structure of the article is generated that includes a negative shape of the material-free regions.

It has been recognised that undesirable critical locations in material-free regions of an article can be more easily recognised and allocated by a person performing the check if this person is holding the material-free regions in his or her hands as a negative shape of the article, which he or she can perceive both visually and by touch. This allows the design or amendments to the design to be performed in a targeted manner.

Moreover, where appropriate it may also be possible to understand the mode of operation of the article better because, for example, flow pathways may be clearly followed by the eye, using a three-dimensional body representing the article. As a result, the inner workings of the article may be kept in view as it is started up, as a result of which the internal sequences can be better understood by operating personnel.

If the article includes a plurality of material-free regions that are isolated from one another by surrounding material, it is favourable if, in the test structure, these isolated material-free regions each take the form of an individual negative shape and are connected to one another by way of at least one connection member. Otherwise, individual negative shapes would be generated which would then be present as loose individual bodies, without mirroring the relative position in the article of the material-free regions in question.

The method is particularly well suited to articles whereof the material-free regions include a duct system.

The test structure is preferably produced by means of a generative manufacturing method.

Here, it may be particularly advantageous if there is used as the prototype for the generative manufacturing method a computer model of the material-free regions.

Preferably, the computer model of the material-free regions is generated by means of a CAD system, as an inverted model on the basis of a CAD model of the article.

In practice, it has been possible to use the method particularly effectively for articles through which fluid media can flow. With these, as indicated above, it is important for the fluid flow to be guided through the duct system of the component largely without disruption.

It is to be understood that the aspects and objects of the present invention described above may be combinable and that other advantages and aspects of the present invention will become apparent upon reading the following description of the drawings and detailed description of the invention.

BRIEF DESCRIPTION OF THE DRAWINGS

An exemplary embodiment of the invention will be explained in more detail below with reference to the drawings, in which.

DETAILED DESCRIPTION OF THE PRESENT INVENTION

Figure 1:
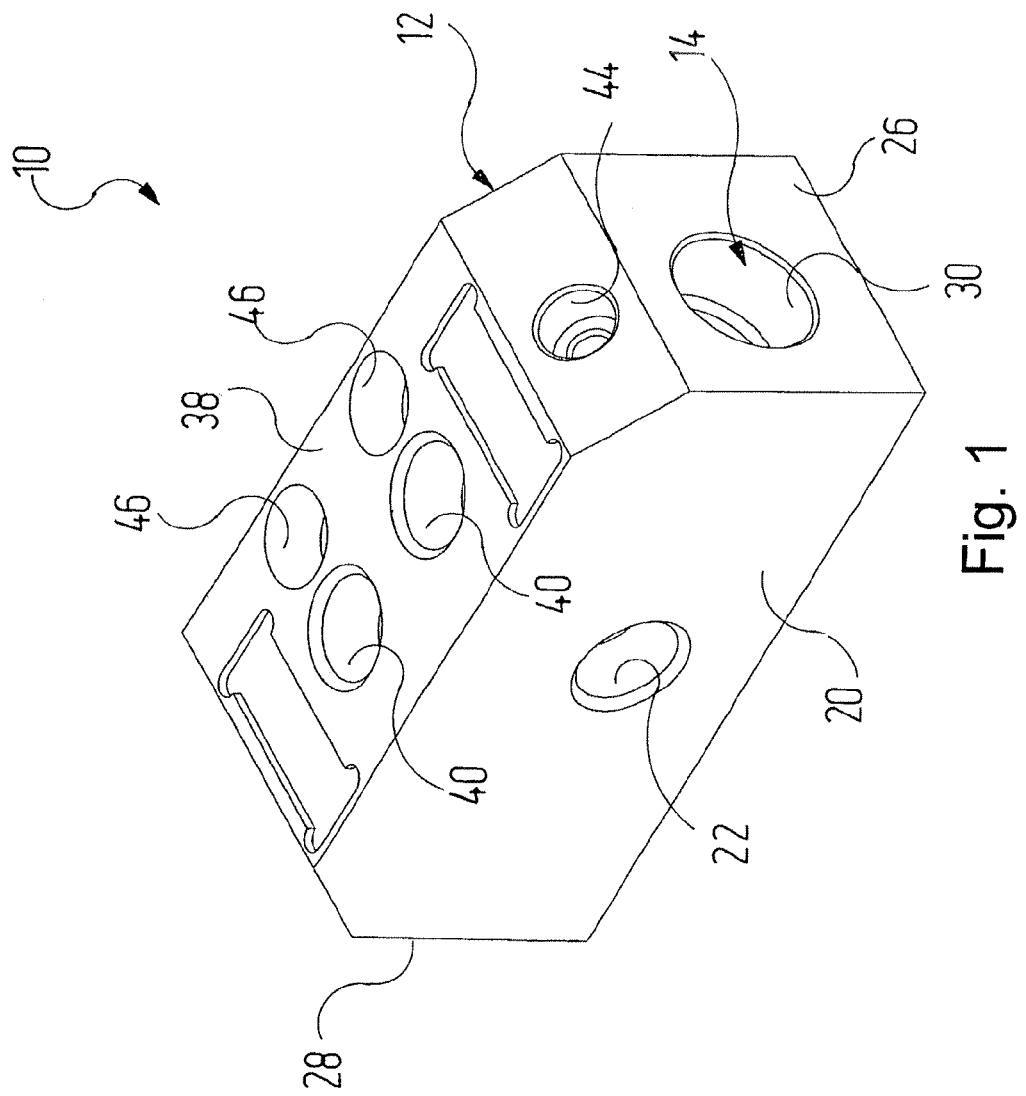
FIG. 1 shows, as an example of a test article, a perspective view of a colour-changing unit for paints that has material-free regions.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

FIG. 1 shows, as an example of an article to be checked, a colour-changing unit 10 which has a one-part housing block 12, as is known per se, and through which paints to be applied flow.

Figure 2:
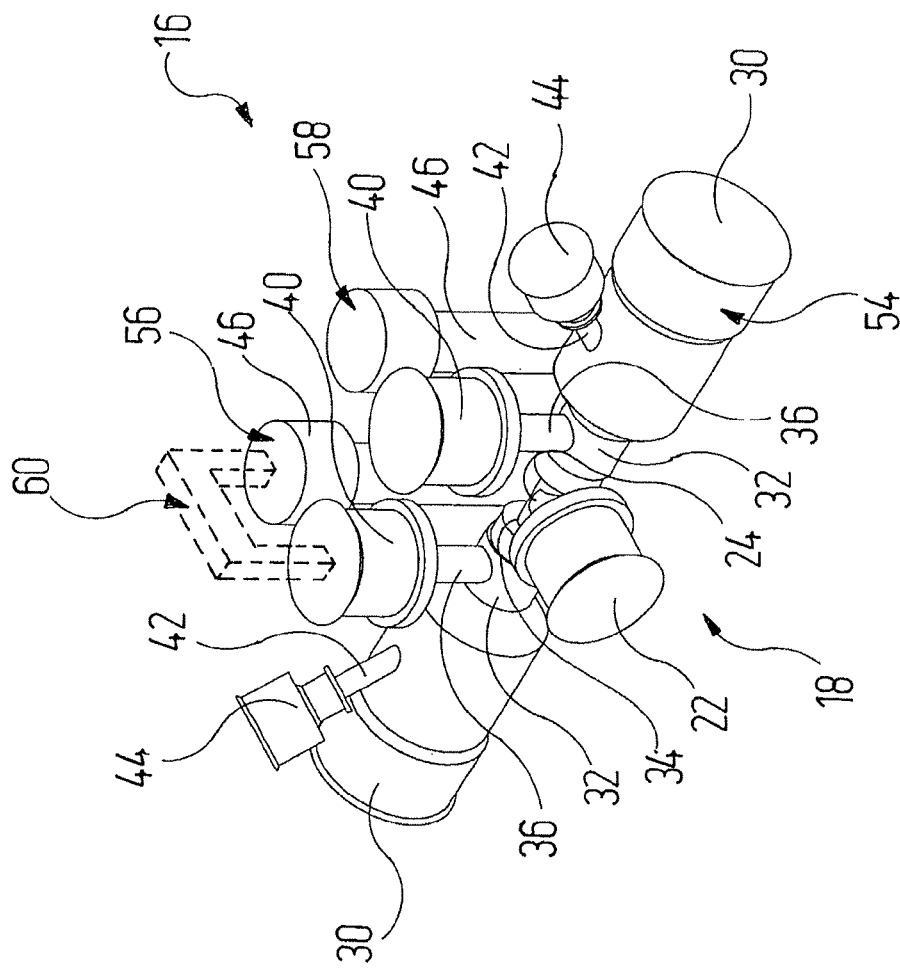
FIG. 2 shows a three-dimensional test structure of the article, which includes a negative shape of the material-free regions of the colour-changing unit.

In the housing block 12 there are material-free regions which are designated 14 overall and can be recognised in the form of a test structure 16 in FIG. 2, which in practice is constructed as an article and in three dimensions. The test structure 16 includes a negative shape 18 of the material-free regions 14 of the colour-changing unit 10. In FIG. 2, the regions and portions of the negative shape 18 which mirror material-free regions and portions of the colour-changing unit 10 that are explained below are provided with the same reference numerals as these material-free regions in FIG. 1. In this context, some of the ducts and spaces explained below that are in the interior of the colour-changing unit 10 are only visible from FIG. 2.

Provided on an output side 20 of the housing block 12 is an output connection bore 22 which opens into a central distributor space 24. The distributor space 24 may be connected by way of the output connection bore 22 to, for example, the supply line of an electrostatically operating application means (not illustrated here).

On two mutually opposed end faces 26, 28, which extend perpendicular to the output side 20, the housing block 12 has valve-receiving bores 30 which each open into antechambers 32 adjacent to the distributor space 24. The antechambers 32 are in turn connected to the distributor space 24 by way of a respective opening 34 resembling a valve seat. This opening 34 may be closed off by the closing element of a valve (not itself shown here) that is actuated by compressed air and is seated in the valve-receiving bore 30, as is known per se.

In each case a secondary duct 36 extends, from the antechambers 32, in the direction of a further infeed side 38 which is surrounded by the output side 20 and the end faces 26 and 28 and opens into an infeed connection bore 40 that ends flush with the infeed side 38. By way of each infeed connection bore 40, the colour-changing unit 10 may be connected to a supply line hose of a reservoir that receives a particular colour, the last two named of these components not being illustrated here. Each secondary duct 36 is connected by way of the associated antechamber 32 and the opening 34 to the distributor space 24 of the colour-changing unit 10.

In each case, a respective compressed air duct 42 extends from the valve-receiving bores 30 and opens into a respective compressed air connection bore 44 for a compressed air hose (not illustrated here) of a valve control system (similarly not shown here). By means of a valve control system that is known per se, the valves indicated above may be acted upon by compressed air, as a result of which the opening 34 to the distributor space 24 can be selectively released or closed off by way of the closure element.

Two parallel securing passages 46 extend from the infeed side 38 to the opposite side of the housing block 12, and screws by means of which the colour-changing unit 10 can be secured for example to a robot arm may be guided through these securing passages 46. As can be seen from FIG. 2, the passage bores 46 are stepped in shape such that the head of a corresponding screw may be countersunk.

In the case of the colour-changing unit 10 illustrated here, the output connection bore 22, the distributor space 24, the valve-receiving bores 30 having the antechambers 32, the secondary ducts 36 and the infeed connection bores 40, and the compressed air ducts 42 and the compressed air connection bores 44, thus overall form a duct system 48 of the colour-changing unit 10.

The duct system 48 illustrated here is of relatively simple construction. Even here, however—as explained at the outset—undercuts may occur in the duct system 48 or narrow pockets and slots and narrow bends and the like may be formed therein, through which flow may be hampered by paint guided through the colour-changing unit 10.

Figure 3:
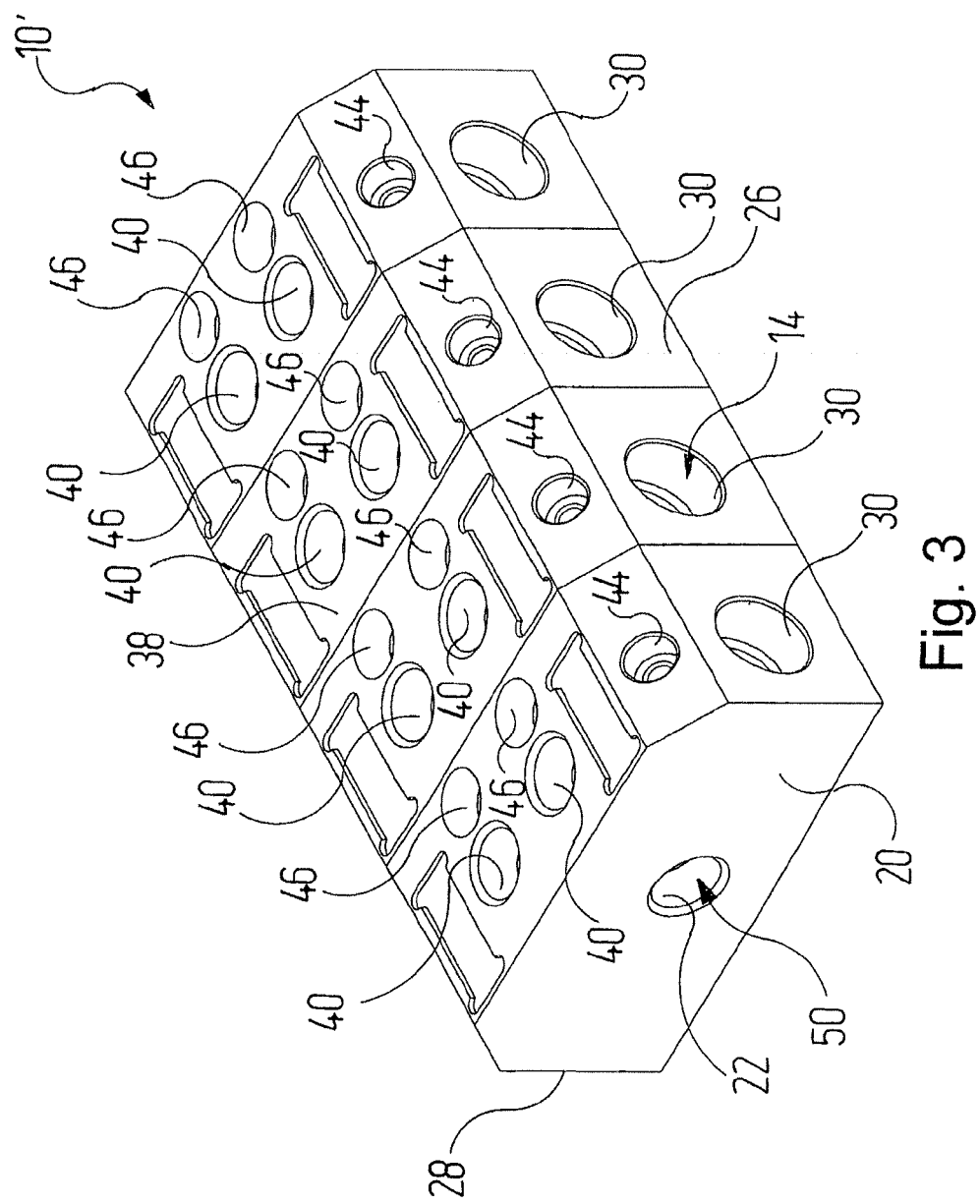
FIG. 3 shows a perspective view of a colour-changing unit that is of more complicated construction than the colour-changing unit of FIG. 1.

As an example of an article which includes a more complex duct system or a more complex system 50 comprising material-free regions than the colour-changing unit 10, a colour-changing unit 10' which is larger than the colour-changing unit 10 is shown in FIG. 3. Here, components which are otherwise functionally equivalent bear the same reference numerals as in the case of the colour-changing unit 10. As can be seen in FIG. 3, the colour-changing unit 10' includes significantly more infeed connection bores 40, with the result that it is possible to guide more different paints through the duct system 52 to the output connection bore 22 by way of this unit.

To check the colour-changing unit 10, a three-dimensional test structure of the article is therefore generated, as shown by way of example in FIG. 2 in the form of the test structure 16 for the material-free regions 14 of the colour-changing unit 10.

In the colour-changing block 10, the securing passages 46 and the duct system 48 are in each case constructed such that they are separated from one another by material of the housing block 12. The duct system 48 and the two securing passages 46 thus each form material-free regions of the colour-changing unit 10 and are isolated from one another by material of the housing block 12 that surrounds them.

For this reason, the negative shape 18 of the material-free regions 14 of the colour-changing unit 10 thus includes three individual negative shapes: a first individual negative shape 54 of the duct system 48, a second individual negative shape 56 of one of the two securing passages 46, and a third individual negative shape 58 of the other of the two securing passages 46.

So that these individual negative shapes 54, 56 and 58 mirror the overall arrangement of the material-free regions 14 of the colour-changing unit 10 in a cohesive arrangement in the test structure 16, and are not merely present as loose individual elements, the individual negative shapes 54, 56, 58 are connected to one another by connection members.

FIG. 2 indicates by way of dashed lines and by way of example only one connection member of this kind, in the form of a bridging element 60 which connects to one another the first individual negative shape 54 of the duct system 48 and the second individual negative shape 56 of the one securing passage 46.

The third individual negative shape 58 may be connected by way of a corresponding connection member to the first individual negative shape 54 of the duct system 48 or else, or additionally, to the second individual negative shape 56 of the first securing passage 46.

In order to produce the test structure 16, a generative manufacturing method is used. Generative manufacturing methods are also known by the term rapid prototyping.

In principle, all known generative manufacturing methods are suitable. The list below is intended to, and therefore can, only give an overview and is not comprehensive—in respect of the materials indicated in each case as well. A test structure may in particular be prepared by means of:

- 3D printing. In this case starting materials that may be used are for example synthetic materials, powdered lime with an epoxy shell or acrylic-based photopolymers.
- Fused Deposition Modelling (FDM). Preferred materials here are acrylonitrile butadiene styrene copolymer (ABS) and polycarbonates.
- Multi Jet Modelling. Here, wax-like thermoplastics and UV photopolymers are in particular used.
- Polyamide casting, using polyamides.
- Selective laser melting (SLM). This method may be performed using, for example, metals, synthetic materials or ceramics.
- Selective Laser Sintering. Here, among other things thermoplastics such as polycarbonates, polyamides or polyvinyl chloride but also metals or ceramics may serve as the base material.
- Space Puzzle Moulding (SPM). This method is performed with synthetic materials.
- Stereolithography (SL or SLA), in which in particular liquid thermosetting materials or elastomers are used.

In order to produce the test structure 14 for the colour-changing unit 10, an existing CAD model of the colour-changing unit 10 is used, or first of all one is generated using a CAD system that is known per se. Then, a computer model of the material-free regions 14 is generated by means of the CAD system, as an inverted model based on the CAD model of the colour-changing unit 10. The computer model of the material-free regions 14 then provides the operational parameters for the generative manufacturing method that is used, and the test structure 16 is manufactured.

Here, one or more connection members 60 may—if necessary—be determined manually or calculated automatically.

It is to be understood that additional embodiments of the present invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

The invention claimed is:

1. A method for checking an article with material-free regions comprising:
   generating a three-dimensional test structure of the article which mirrors a negative shape of the material-free regions of an article.

2. The method according to claim 1, wherein, if the article includes a plurality of material-free regions that are isolated from one another by surrounding material, in the test structure these isolated material-free regions each take the form of an individual negative shape and are connected to one another by way of at least one connection member.

3. The method according to claim 1, wherein articles whereof the material-free regions include a duct system are checked.

4. The method according to claim 1, wherein the test structure is produced by a generative manufacturing method.

5. The method according to claim 4, wherein there is used as a prototype for the generative manufacturing method a computer model of the material-free regions.

6. The method according to claim 5, wherein the computer model of the material-free regions is generated by a CAD system, as an inverted model on the basis of a CAD model of the article.

7. The method according to claim 1, wherein the article is a component through which fluid media can flow.

8. The method according to claim 1, wherein the test structure includes multiple structures.

9. The method according to claim 8, wherein the multiple structures are connected by at least one connection member.

10. The method according to claim 1 further comprising the step of checking the negative shape of the article by inspecting the test structure.

* * * * *